US009443558B1

(12) United States Patent
Hung et al.

(10) Patent No.: US 9,443,558 B1
(45) Date of Patent: Sep. 13, 2016

(54) STORAGE DEVICE ACCOMMODATING STRUCTURE

(71) Applicants: CAL-COMP ELECTRONICS & COMMUNICATIONS COMPANY LIMITED, New Taipei (TW); KINPO ELECTRONICS, INC., New Taipei (TW)

(72) Inventors: Ming-Hua Hung, New Taipei (TW); Tung-Kai Tsai, New Taipei (TW)

(73) Assignees: CAL-COMP ELECTRONICS & COMMUNICATIONS COMPANY LIMITED, New Taipei (TW); KINPO ELECTRONICS, INC., New Taipei (TW)

( * ) Notice: Subject to any disclaimer, the term of this patent is extended or adjusted under 35 U.S.C. 154(b) by 0 days.

(21) Appl. No.: 14/837,503

(22) Filed: Aug. 27, 2015

(30) Foreign Application Priority Data

Aug. 4, 2015 (CN) .......................... 2015 1 0469358

(51) Int. Cl.
*H05K 5/00* (2006.01)
*G11B 33/02* (2006.01)
*H05K 5/02* (2006.01)

(52) U.S. Cl.
CPC ........... *G11B 33/022* (2013.01); *H05K 5/0217* (2013.01)

(58) Field of Classification Search
CPC ..... G11B 33/022; H05K 5/02; H05K 5/0217
See application file for complete search history.

(56) References Cited

U.S. PATENT DOCUMENTS

| 2005/0057849 | A1* | 3/2005 | Twogood | G11B 33/022 360/97.12 |
| 2005/0081224 | A1* | 4/2005 | Hsu | G06F 1/181 720/657 |
| 2005/0188385 | A1* | 8/2005 | Ichikawa | G11B 33/022 720/600 |
| 2006/0171109 | A1* | 8/2006 | Chang | G06F 1/184 361/679.33 |
| 2006/0171110 | A1* | 8/2006 | Li | G06F 1/184 361/679.37 |
| 2015/0268698 | A1* | 9/2015 | Hofmann | G06F 1/182 455/575.8 |
| 2016/0120055 | A1* | 4/2016 | Lin | H05K 7/14 312/223.2 |

* cited by examiner

*Primary Examiner* — Daniel Rohrhoff
(74) *Attorney, Agent, or Firm* — Chun-Ming Shih; HDLS IPR Services

(57) ABSTRACT

A storage device accommodating structure for positioning a storage device includes a chassis, a press plate, a pair of supporting stands and an elastic member. The press plate is moveably arranged inside the chassis, the pair of supporting stands are moveably and alternatively arranged at one lateral side of the press plate, one side of each one of the supporting stands is connected to the press plate and another side thereof abuts against the chassis, the elastic member is elastically arranged among the press plate, each one of the supporting stands and the chassis; therefore, the press plate is able to adjust a position thereof and to press onto the storage device via an elastic recovery force of the elastic member. Accordingly, the storage device can be firmly inserted inside the chassis and maintain an excellent electrical connection with the connector.

10 Claims, 8 Drawing Sheets

STORAGE DEVICE ACCOMMODATING STRUCTURE

BACKGROUND OF THE INVENTION

1. Field of the Invention

The present invention is related to an external storage device, in particular, to a storage device accommodating structure.

2. Description of Related Art

Typically, a large amount of electronic data is stored in a hard disk secured inside a computer. However, the storage capacity of hard disk is limited; as a result, a practical method widely adapted by users is to use an additional external backup storage device in order to increase an extra data storage space or to use for data backup purposes.

Furthermore, currently, most external storage devices are removable storage devices. Since the assembly of the removable storage device cassette (chassis) allows a direct removable method to replace the storage device that is desired to be removed. Therefore, it provides great convenience to its practical uses.

However, there are various external storage devices of different brands available in the market, and despite the fact that they have common connector specifications among various brands, their outer dimensions, such as thicknesses, still slightly vary from one another. As a result, when the user inserts a storage device of a different brand into the storage device cassette (chassis), the storage device cannot be firmly attached onto the connector, which is likely to affect the electrical connection due to vibrations, or even leading to damages on the connector. Therefore, an objective of the inventor of the present invention is to overcome the problem of how to allow the storage device to be firmly position inside the storage device cassette (chassis).

SUMMARY OF THE INVENTION

The present invention provides a storage device accommodating structure capable of allowing a storage device to be firmly inserted inside a chassis and to maintain an excellent electrical connection with the connector.

In an embodiment of the present invention, a storage device accommodating structure of the present invention is used for accommodating and positioning storage devices of different dimensions therein and comprises a chassis, a press plate, a pair of supporting stands and an elastic member. The press plate is moveably arranged inside the chassis, the pair of supporting stands are moveably and alternatively arranged at one lateral side of the press plate, one side of each one of the supporting stands is connected to the press plate and another side thereof abuts against the chassis, the elastic member is elastically arranged among the press plate, each one of the supporting stands and the chassis; thereby, the press plate is able to adjust a position thereof and to press onto the storage device via the elastic recovery force of the elastic member.

In another embodiment of the present invention, a storage device accommodating structure of the present invention is used for positioning a storage device and comprises a chassis, a positioning supportive portion, a first press plate, a pair of first supporting stands, a first elastic member, a second press plate, a pair of second supporting stands and a second elastic member. The positioning supportive portion is arranged inside the chassis, the first press plate is moveably arranged inside the chassis, the pair of first supporting stands are moveably and alternatively arranged at one lateral side of the first press plate, the first elastic member is elastically arranged between the first press plate and the pair of first supporting stands, each one of the first supporting stands abuts against the first press plate via an elastic force of the first elastic member in order to allow the first press plate to accommodate and press onto the storage device of different dimensions in order to adjust a position thereof inside the chassis, the second press plate is parallel to the first press plate and moveably arranged inside the chassis, the pair of second supporting stands are moveably and alternatively arranged at one lateral side of the second press plate, the second elastic member is elastically arranged between the second press plate and the pair of second supporting stands, each one of the second supporting stands abuts against the second press plate via an elastic force of the second elastic member in order to allow the second press plate to accommodate and press onto the storage device of different dimensions in order to adjust a position thereof inside the chassis.

In comparison to the prior arts, the positioning supportive structure of the present invention allows the press plate to be moveably arranged inside the chassis and further allows one side of a pair of supporting stands to connect to the press plate and another side thereof abuts against the chassis. Furthermore, the elastic member is elastically arranged between the press plate, the supporting stands and the chassis. Accordingly, the press plate is able to use the elastic recovery force of the elastic member to adjust the position inside the chassis and to press onto the storage device such that when the storage device is inserted into the chassis, the press plate and the supporting stands are compressed by the storage device in order to effect the elastic member in order to achieve the adjustment of the distance between the press plate and the chassis. Consequently, the press plate is moveable and is able to support one lateral side of the storage device in order to allow the storage device to be firmly inserted inside the chassis without any deviation or wobbling and to maintain an excellent electrical connection with the connection; therefore, the convenience and practical uses of the present invention can be enhanced.

DETAILED DESCRIPTION OF THE INVENTION

The following provides a detailed description on the embodiments and technical content related to the present invention along with the accompanied drawings. However, it shall be understood that the accompanied drawings are provided for illustration purposes only and shall not be treated as limitations of the present invention.

Figure 1:
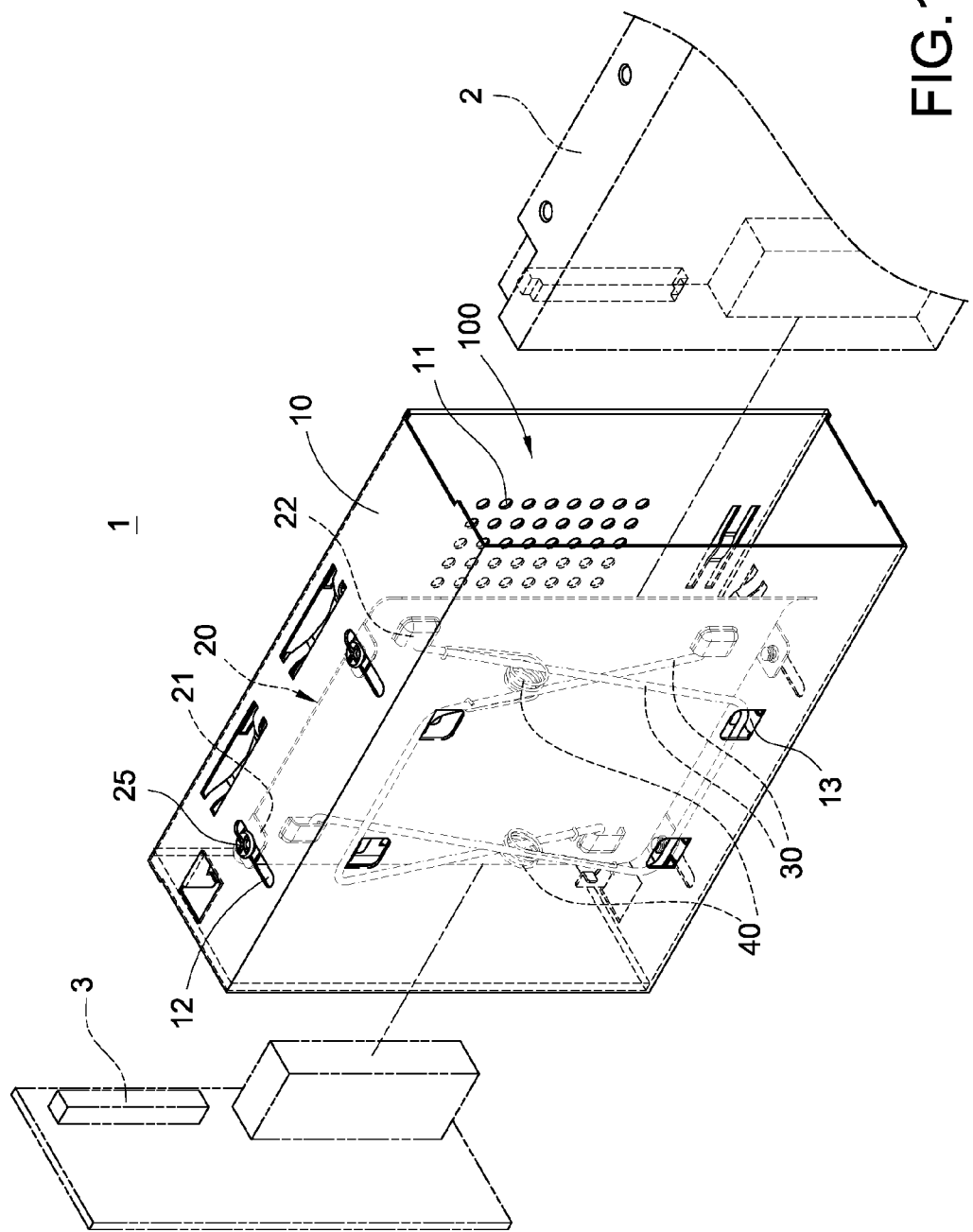
FIG. 1 is a perspective outer view of a storage device accommodating structure of the present invention.
Figure 2:
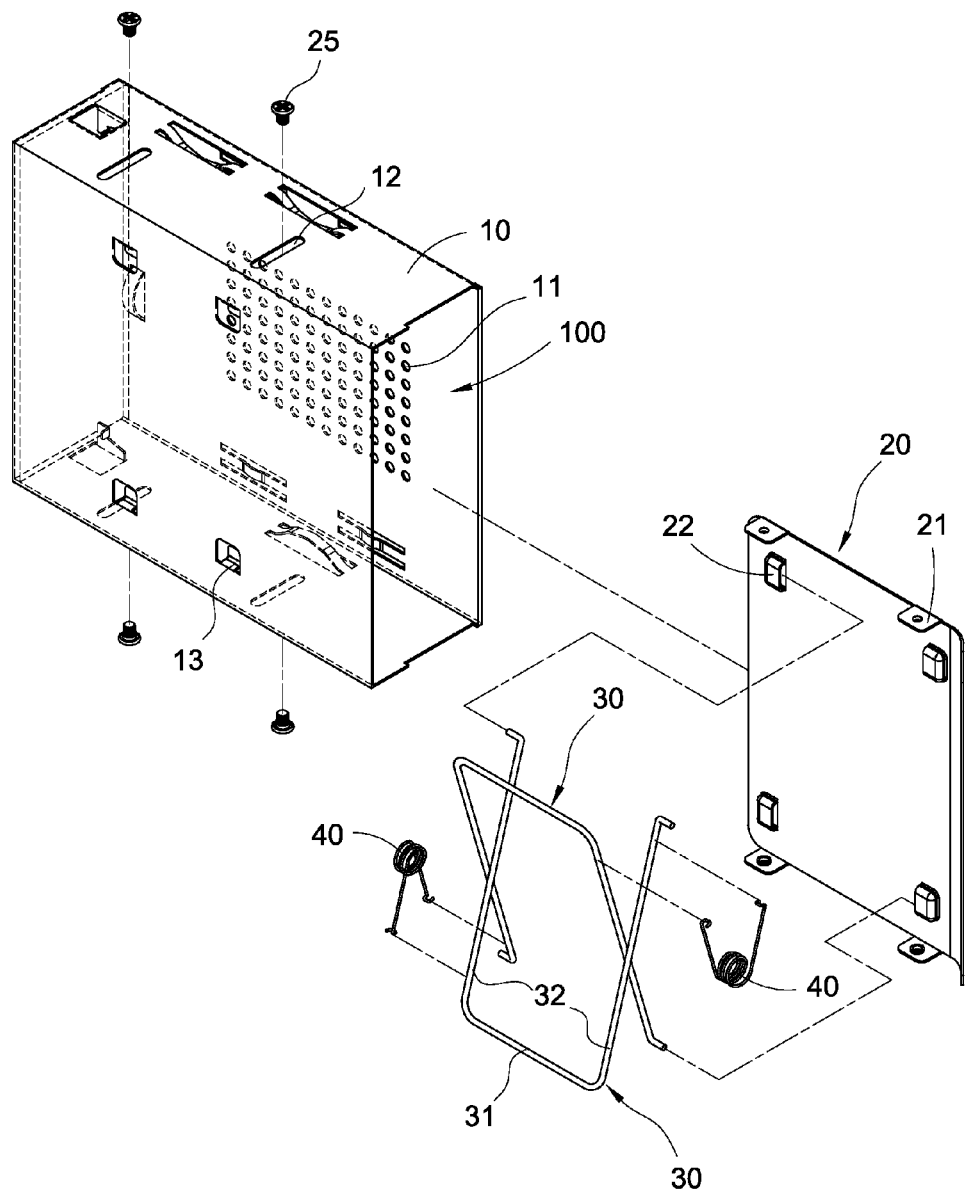
FIG. 2 is another perspective outer view of a storage device accommodating structure of the present invention.
Figure 3:
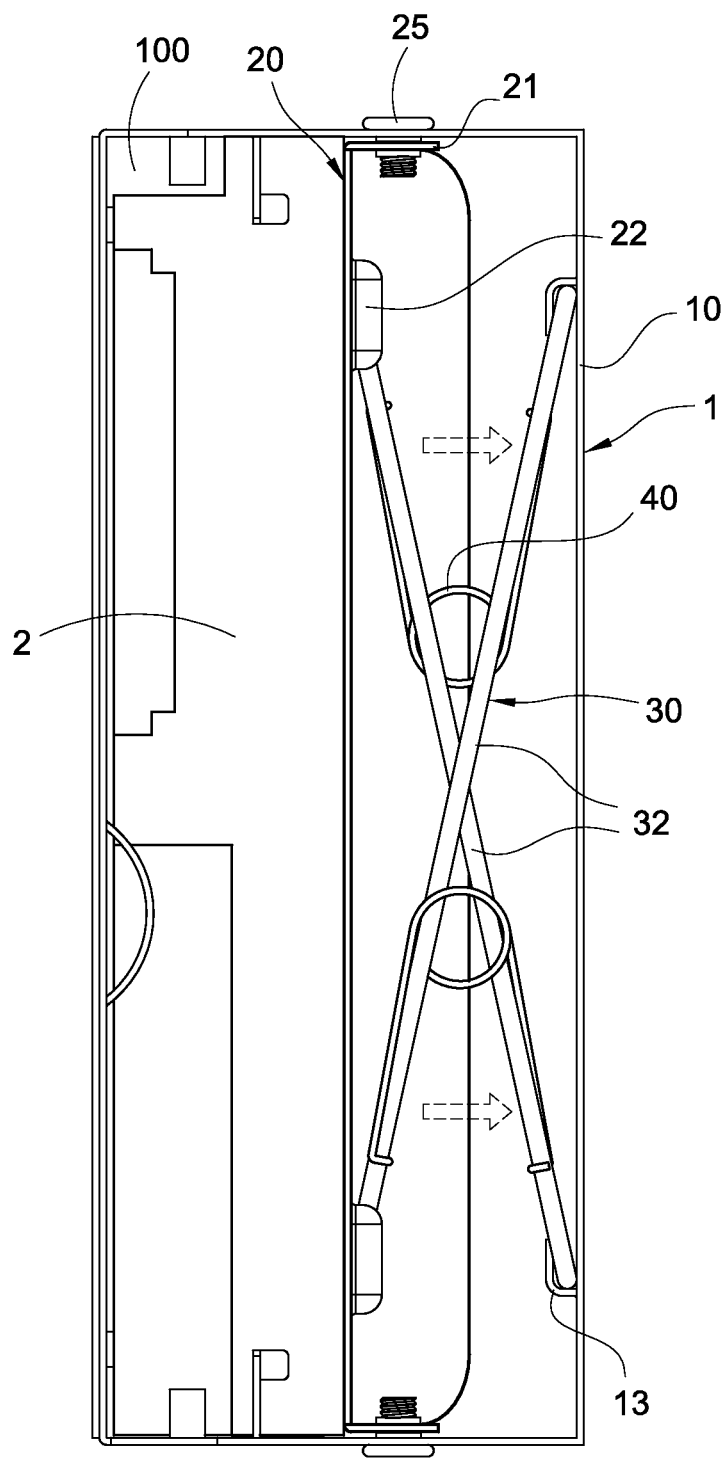
FIG. 3 is an illustration showing a use of a storage device accommodating structure of the present invention.

Please refer to FIG. 1 to FIG. 3, showing a perspective outer view, a perspective exploded view and an illustration of use of a storage device accommodating structure of the present invention respectively. The storage device accommodating structure 1 of the present invention is used for positioning a storage device 2 comprising a chassis 10, a press plate 20, a pair of supporting stands 30 and an elastic member 40. The press plate 20 and the pair of supporting stands 30 are arranged inside the chassis 10. The press plate 20 uses the elastic member 40 to form an accommodating space 100 with an inner wall of the chassis 10. The accommodating space 100 is provided to allow the storage device 2 to be inserted and placed therein, and the storage device 2 abuts against one lateral side of the press plate 20. Accordingly, the storage device 2 is able to be firmly inserted inside the chassis 10 and to establish a firm electrical connection with a connector 3 inside the storage device 2.

Preferably, the chassis 10 is a metal housing. The press plate 20 is moveably arranged inside the chassis 10. In this embodiment, the chassis 10 further includes a plurality of heat dissipating holes 11 provided for heat dissipation purposes. In addition, the chassis 10 includes a plurality of adjustment holes 12, and two sides of the press plate 20 include a protruding ear 21 formed thereon respectively. The protruding ear 21 uses a fastening member 25 to adjust and secure onto a position at the adjustment hole 12.

The pair of supporting stands 30 are moveably and alternatively arranged on one lateral side of the press plate 20. One side of each one of the supporting stands 30 is connected to the press plate 20 and another side thereof abuts against an inner wall surface of the chassis 10. In an embodiment of the present invention, each one of the supporting stands 30 is a U-shaped shaft. In addition, one lateral surface of the press plate 20 facing toward the pair of supporting stands 30 include a plurality of locking slots 22 formed thereon, and one ends of the plurality of supporting stands 30 are locked onto the locking slots 22. Furthermore, one lateral surface of the chassis 10 facing toward the pair of supporting stands 30 include a plurality of locking hooks 13 formed thereon, and another ends of the plurality of supporting stands 30 are locked onto the locking hooks 13.

Preferably, each one of the supporting stands 30 comprises a connection section 31 and two supporting sections 32 bent to extend from two ends of the connection section 31. Accordingly, the supporting sections 32 of the pair of supporting stands 30 are arranged to intersect with each other to form an X shape in order to be positioned between the press plate 20 and the inner wall of the chassis 10.

Moreover, the elastic member 40 is elastically arranged among the press plate 20, each one of the supporting stands 30 and the chassis 10. Each one of the supporting stands 30 abuts against the press plate 20 via an elastic force of the elastic member 40 in order to allow the press plate 20 to accommodate and to press onto the storage device 2 of different dimensions such that the position thereof inside the chassis 10 can be adjusted. In an embodiment of the present invention, the elastic member 40 is a torsion spring, and the elastic member 40 is arranged between the pair of supporting stands 30. Furthermore, the two ends of the elastic member 40 are correspondingly connected to the pair of supporting stands 30 respectively.

Accordingly, when the storage device 2 is inserted into the accommodating space 100, the press plate 20 is pressed by the storage device 2, and at this time, the elastic member 40 (torsion spring) is compressed in order to adjust a distance between the pair of supporting stands 30 such that the press plate 20 abuts against one lateral side of the storage device 2. Therefore, the press plate 20 is able to support one lateral side of the storage device 2 in order to allow the storage device 2 to be firmly inserted inside the accommodating space 100 without any deviation or wobbling as well as to maintain an excellent electrical connection between the storage device 2 and the connector 3.

Figure 4:
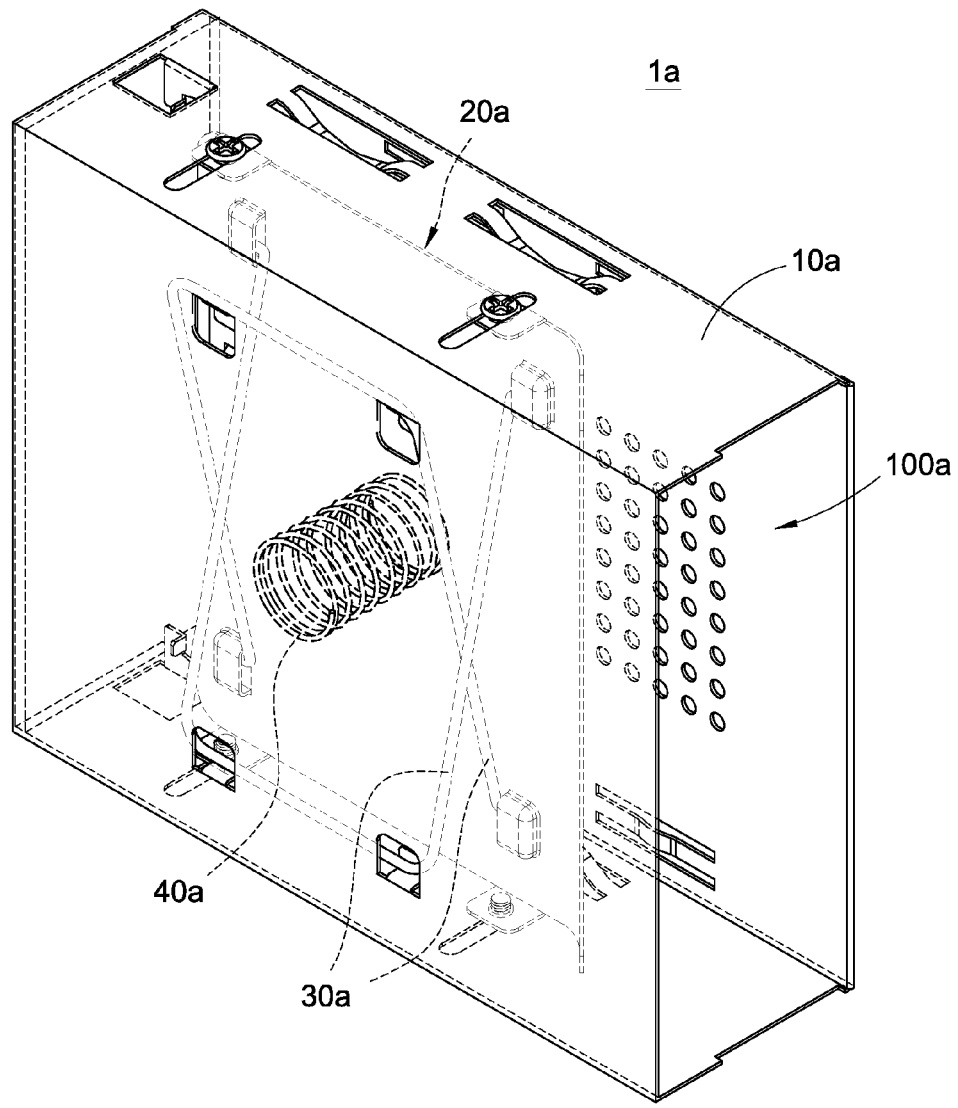
FIG. 4 is a perspective outer view of a storage device accommodating structure according to a second embodiment of the present invention.
Figure 5:
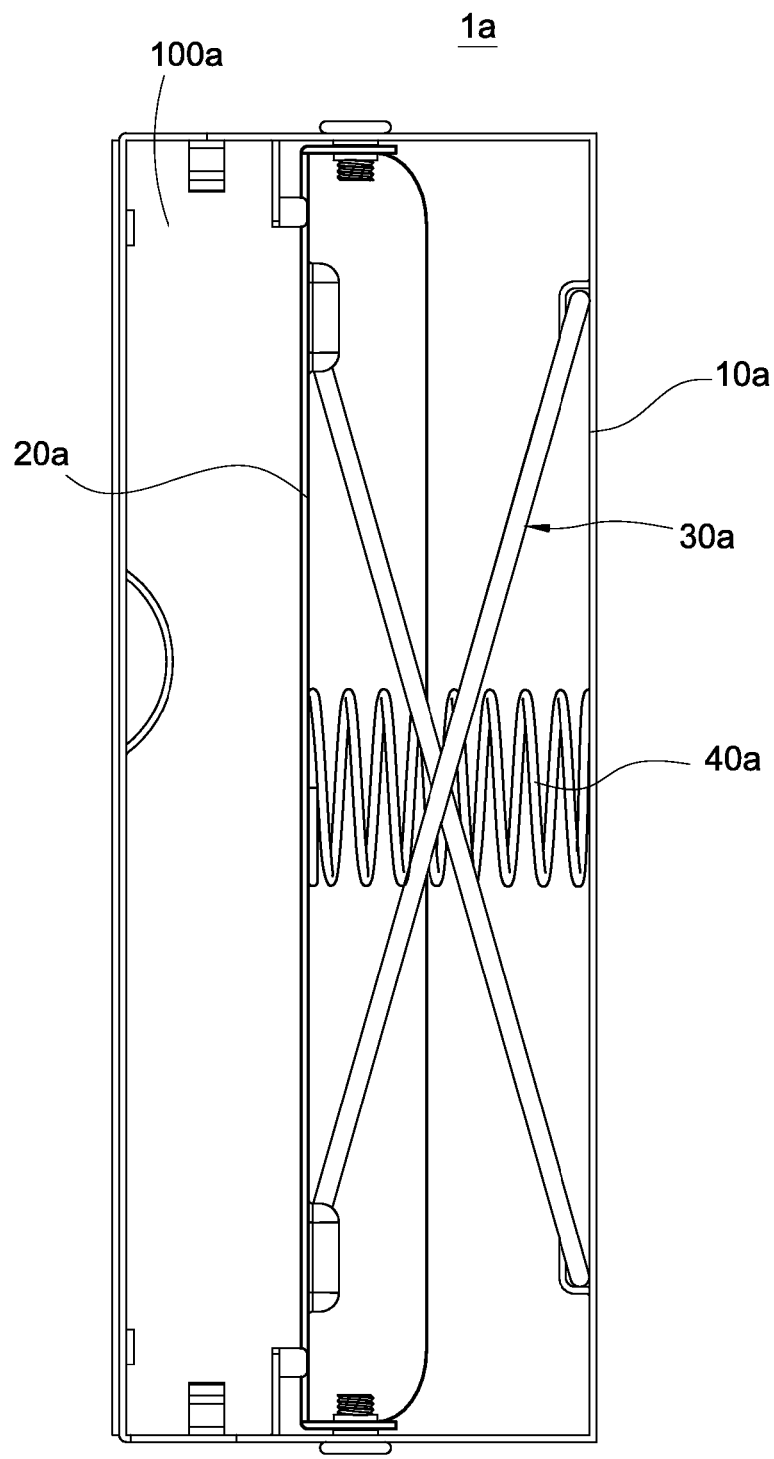
FIG. 5 is an illustration showing a use of a storage device accommodating structure according to the second embodiment of the present invention.

Please refer further to FIG. 4 and FIG. 5, showing a perspective outer view and an illustration of use of a second embodiment of a storage device accommodating structure of the present invention respectively. This embodiment is generally identical to the previous embodiment mentioned above. The supporting structure 1a comprises a chassis 10a, a press plate 20a, a pair of supporting stands 30a and an elastic member 40a. The press plate 20a and the pair of supporting stands 30a are arranged inside the chassis 10a. The press plate 20a uses the elastic member 40a to form an adjustable accommodating space 100a with an inner wall of the chassis 10a.

The difference between this embodiment and the previous embodiment mentioned above relies in the configuration of the elastic member 40a. In this embodiment, the elastic member 40a is configured to be a compression spring, and two ends of the elastic member 40a are connected to the press plate 20a and the chassis 10a respectively. When the press plate 20a is compressed subject to an external force (exerted by the storage device), the elastic member 40a (compression spring) is compressed in order to adjust the distance between the pair of supporting stands 30a such that the press plate 20a is able to abut against a storage device (not shown in the figure) inserted and placed inside the accommodating space 100a.

Figure 6:
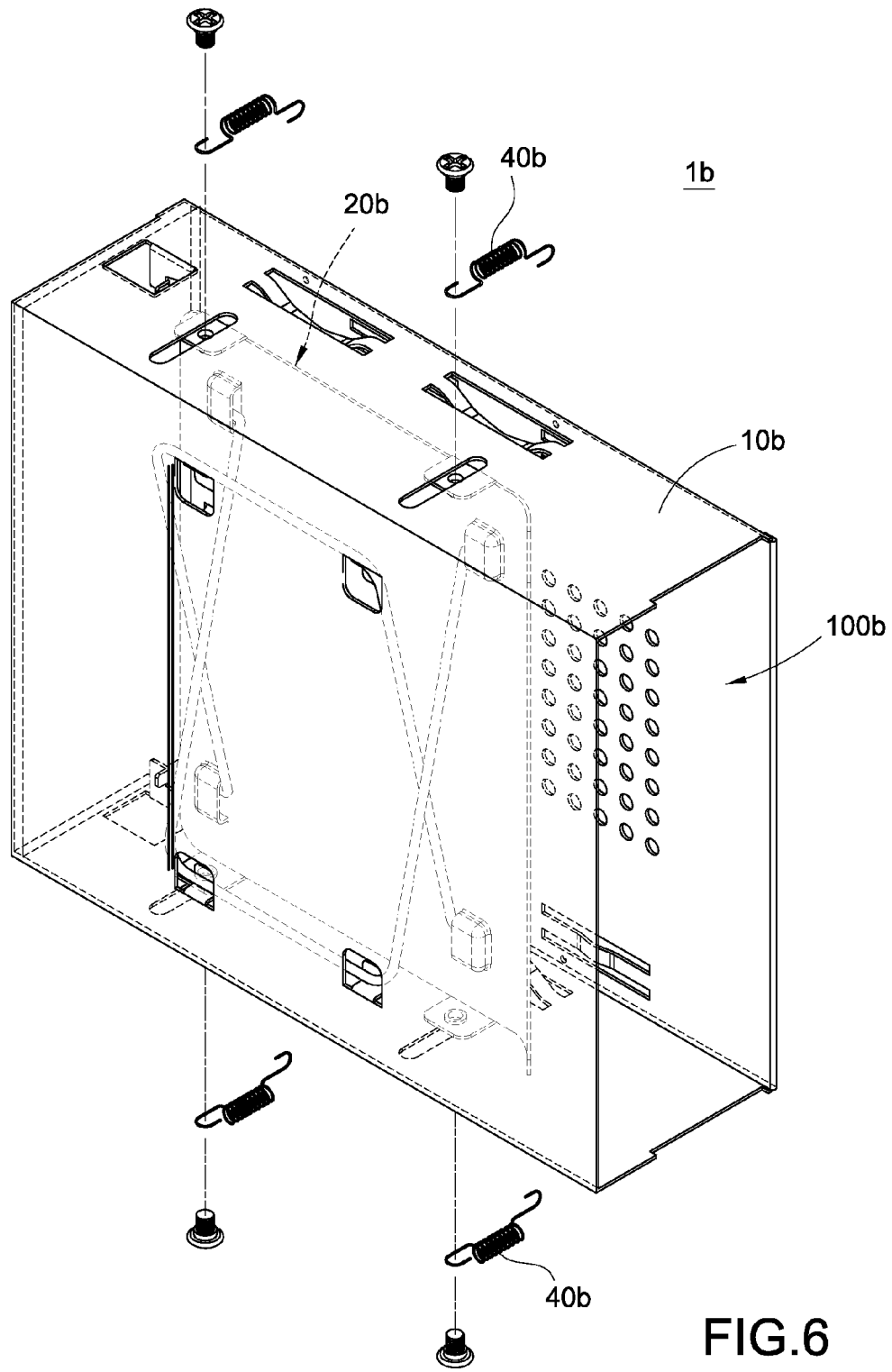
FIG. 6 is a perspective outer view of a storage device accommodating structure according to a third embodiment of the present invention.
Figure 7:
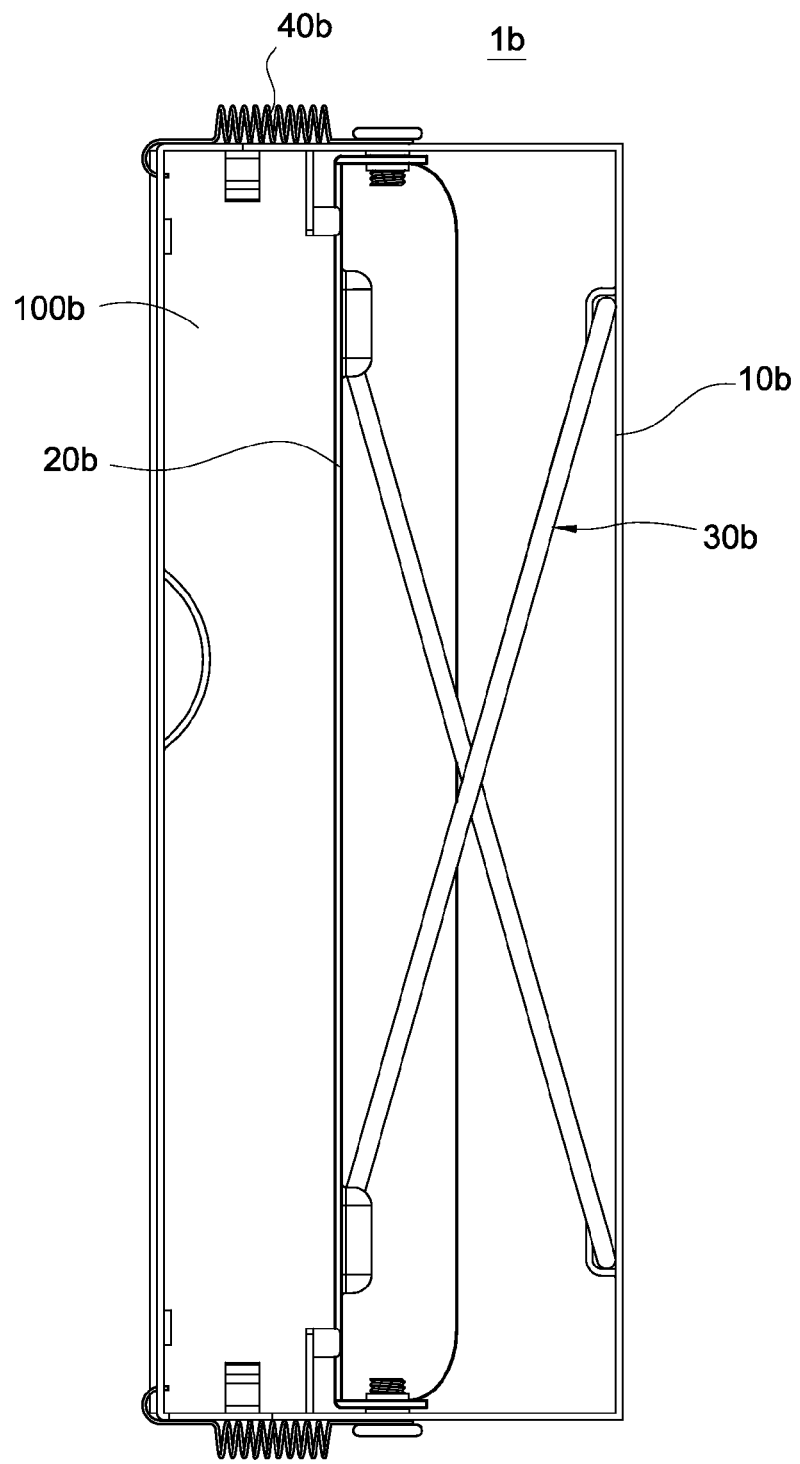
FIG. 7 is an illustration showing a use of a storage device accommodating structure according to the third embodiment of the present invention.

Please refer further to FIG. 6 and FIG. 7, showing a perspective outer view and an illustration of use of a third embodiment of a storage device accommodating structure of the present invention respectively. This embodiment is generally identical to the previous embodiment mentioned above. The supporting structure 1b comprises a chassis 10b, a press plate 20b, a pair of supporting stands 30b and an elastic member 40b. The press plate 20b and the pair of supporting stands 30b are arranged inside the chassis 10b. The press plate 20b uses the elastic member 40b to form an adjustable accommodating space 100b with an inner wall of the chassis 10b.

The difference between this embodiment and the previous embodiment mentioned above relies in the configuration of the elastic member 40b. In this embodiment, the elastic member 40b is configured to be an extension spring, and two ends of the elastic member 40b are connected to the press plate 20b and the chassis 10b respectively. In this embodiment, the elastic member 40b is arranged on an external wall surface of the chassis 10b; however, in an actual practice, it is not limited to such configuration only. Similarly, when the press plate 20b is compressed subject to an external force (exerted by the storage device), the elastic member 40b (compression spring) is extended in order to adjust the distance between the pair of supporting stands 30b such that the press plate 20b is able to abut against a storage device (not shown in the figure) inserted and placed inside the accommodating space 100b.

Figure 8:
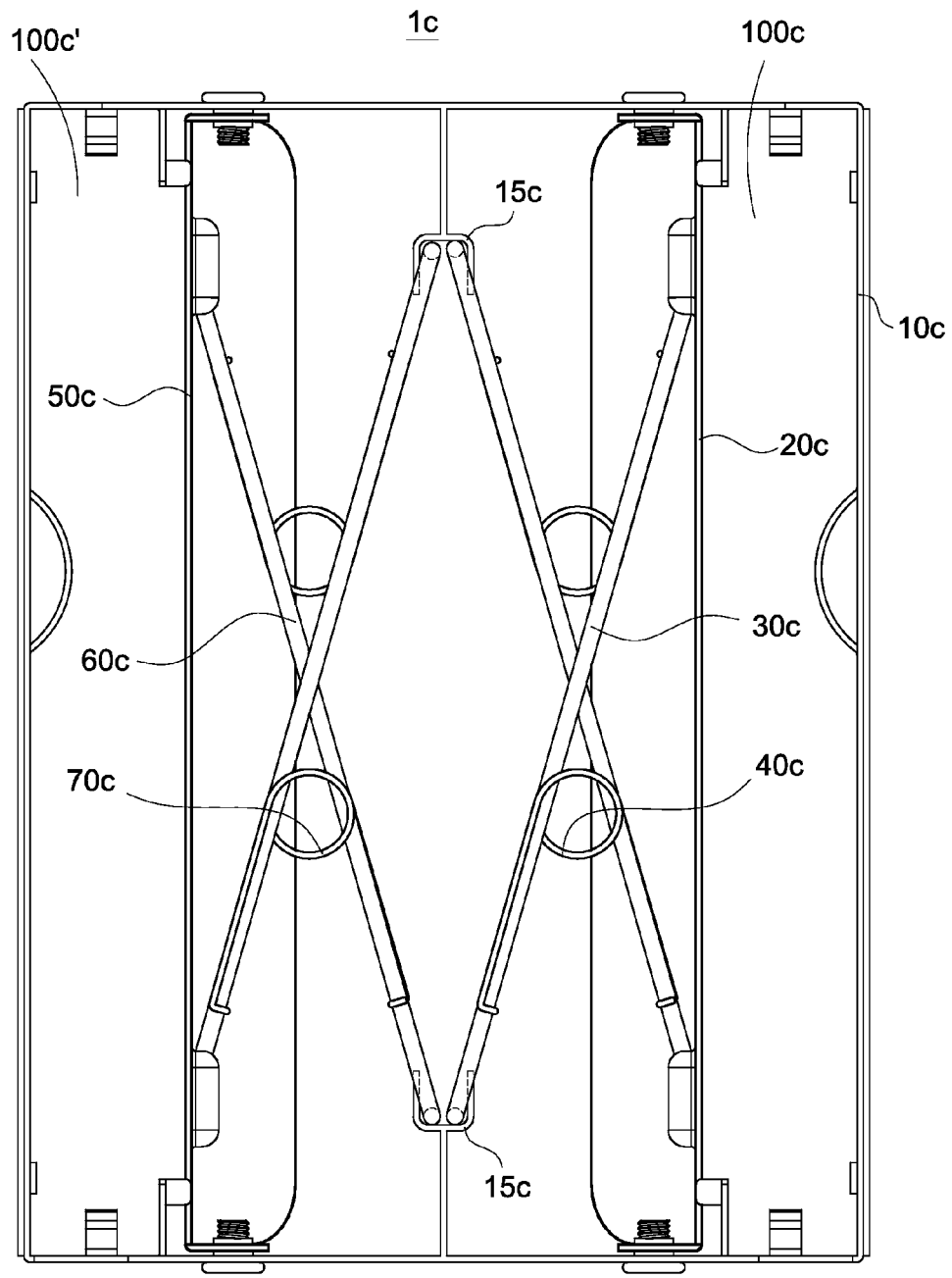
FIG. 8 is a side outer view of a storage device accommodating structure according to a fourth embodiment of the present invention.

Please refer to FIG. 8, showing a side view of a fourth embodiment of a storage device accommodating structure of the present invention. In this embodiment, the supporting structure 1c comprises a chassis 10c, a positioning supportive portion 15c, a first press plate 20c, a pair of first supporting stands 30c, a first elastic member 40c, a second press plate 50c, a pair of second supporting stands 60c and a second elastic member 70c. The first press plate 20c, the positioning supportive portion 15c, the pair of first supporting stands 30c, the second press plate 50c and the pair of second supporting stands 60c are arranged inside the chassis 10c. In addition, the pair of first supporting stands 30c and the pair of second supporting stands 60c are arranged between the first press plate 20c and the second press plate 50c.

As shown in FIG. 8, the positioning supportive portion 15c is arranged inside the chassis 10c. In this embodiment, the positioning supportive portion 15c is a pair of locking hooks extended to protrude from an inner wall of the chassis 10c; however, in an actual practice, it is not limited to such configuration only. In addition, the first supporting stands 30c are moveably and alternatively arranged on one lateral side of the first press plate 20c. One side of each one of the first supporting stands 30c is connected to the first press plate 20c and another side thereof abuts against the positioning supportive portion 15c. Furthermore, the first elastic member 40c is elastically arranged between the first press plate 20c and the pair of first supporting stands 30c. The pair of first supporting stands 30c and the first press plate 20c use the first elastic member 40c to form an adjustable first accommodating space 100c with an inner wall surface of the chassis 10c.

Moreover, the second press plate 50c is parallel to the first press plate 20c in order to be moveably arranged inside the chassis 10c. The pair of second supporting stands 60c are moveably and alternatively arranged on one lateral side of the second press plate 50c. One side of each one of the second supporting stands 50c is connected to the second press plate 50c and another side thereof abuts against the positioning supportive portion 15c. The first supporting stands 60c and the second press plate 50c use the second elastic member 70c to form an adjustable second accommodating space 100c' with an inner wall surface of the chassis 10c. Furthermore, each one of the first supporting stands 30c abuts against the first press plate 20c via an elastic force of the first elastic member 40c in order to allow the first press plate 20c to accommodate and press onto a storage device (not shown in the figure) of different dimensions and to adjust a position thereof inside the chassis 10c. In addition, each one of the second supporting stands 60c abuts against the second press plate 20c via an elastic force of the second elastic member 70c in order to allow the second press plate 20c to accommodate and press onto a storage device (not shown in the figure) of different dimensions and to adjust a position thereof inside the chassis 10c. Accordingly, the first accommodating space 100c and the second accommodating space 100c' of the chassis 10c can be provided for the insertion and positioning of different storage devices.

It shall be noted that the above description provides preferred embodiments of the present invention only, which shall not be treated as limitation of the scope of the present invention. Any equivalent techniques and technical modifications based on the content of the specification and drawings of the present invention shall be deemed to be within the scope of the present invention.

What is claimed is:

1. A storage device accommodating structure, used for accommodating and positioning storage devices of different dimensions therein, comprising:
    a chassis;
    a press plate moveably arranged inside the chassis;
    a pair of supporting stands moveably and alternatively arranged at one lateral side of the press plate, one side of each one of the supporting stands connected to the press plate and another side thereof abutted against the chassis; and
    an elastic member elastically arranged among the press plate, each one of the supporting stands and the chassis;
    wherein each one of the supporting stands abuts against the press plate via an elastic force of the elastic member in order to allow the press plate to accommodate and to press onto the storage device of different dimensions in order to adjust a position thereof inside the chassis.

2. The storage device accommodating structure according to claim 1, wherein the chassis includes a plurality of adjustment holes formed thereon, two sides of the press plate include a protruding ear formed thereon respectively, the protruding ear is secured onto the adjustment hole via a fastening member.

3. The storage device accommodating structure according to claim 1, wherein each one of the supporting stands is a U-shaped shaft, a lateral surface of the press plate facing toward the pair of supporting stands includes a plurality of locking slots formed thereon, one ends of the plurality of supporting stands are locked onto the plurality of locking slots.

4. The storage device accommodating structure according to claim 3, wherein each one of the supporting stands includes a connection section and two supporting sections bent to extend from two ends of the connection section, the supporting sections of the pair of supporting stands are arranged to intersect with each other to form an X shape.

5. The storage device accommodating structure according to claim 1, wherein the elastic member is a torsion spring, the elastic member is arranged between the pair of supporting stands, two ends of the elastic member are connected to the pair of supporting stands respectively.

6. The storage device accommodating structure according to claim 1, wherein the elastic member is a compression spring, two ends of the elastic member are connected to the press plate and the chassis respectively.

7. The storage device accommodating structure according to claim 1, wherein the elastic member is an extension spring, two ends of the elastic member are connected to the press plate and the chassis respectively.

8. The storage device accommodating structure according to claim 7, wherein the elastic member is arranged at an outer wall surface of the chassis.

9. A storage device accommodating structure, used for positioning a storage device, comprising:
    a chassis;
    a positioning supportive portion arranged inside the chassis;
    a first press plate moveably arranged inside the chassis;
    a pair of first supporting stands moveably and alternatively arranged at one lateral side of the first press plate, one side of each one of the first supporting stands connected to the first press plate and another side thereof abutted against the positioning supportive portion;
    a first elastic member elastically arranged between the first press plate and the pair of first supporting stands;
    wherein each one of the first supporting stands abuts against the first press plate via an elastic force of the first elastic member in order to allow the first press plate to accommodate and press onto the storage device of different dimensions in order to adjust a position thereof inside the chassis;

a second press plate parallel to the first press plate and moveably arranged inside the chassis;

a pair of second supporting stands moveably and alternatively arranged at one lateral side of the second press plate, one side of each one of the second supporting stands connected to the second press plate and another side thereof abutted against the positioning supportive portion; and a second elastic member elastically arranged between the second press plate and the pair of second supporting stands; wherein each one of the second supporting stands abuts against the second press plate via an elastic force of the second elastic member in order to allow the second press plate to accommodate and press onto the storage device of different dimensions in order to adjust a position thereof inside the chassis.

10. The storage device accommodating structure according to claim 9, wherein the positioning supportive portion is a pair of locking hooks extended to protrude from an inner wall of the chassis.

\* \* \* \* \*